US006668362B1

(12) United States Patent
McIlwain et al.

(10) Patent No.: US 6,668,362 B1
(45) Date of Patent: Dec. 23, 2003

(54) HIERARCHICAL VERIFICATION FOR EQUIVALENCE CHECKING OF DESIGNS

(75) Inventors: Lisa McIlwain, Portland, OR (US); Demosthenes Anastasakis, Tigard, OR (US); Slawomir Pilarski, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 70 days.

(21) Appl. No.: 10/043,737

(22) Filed: Jan. 9, 2002

(51) Int. Cl.⁷ .............................................. G06F 17/50
(52) U.S. Cl. ................... 716/5; 716/5; 716/3
(58) Field of Search ..................... 716/3, 4, 5

(56) References Cited

U.S. PATENT DOCUMENTS

| | | | | | |
|---|---|---|---|---|---|
| 5,249,133 A | * | 9/1993 | Batra | ............................ | 716/5 |
| 5,497,334 A | * | 3/1996 | Russell et al. | .................. | 716/5 |
| 6,026,222 A | * | 2/2000 | Gupta et al. | .................... | 716/5 |
| 6,212,669 B1 | * | 4/2001 | Jain | ............................... | 716/7 |
| 6,336,206 B1 | * | 1/2002 | Lockyear | ....................... | 716/7 |

* cited by examiner

Primary Examiner—Vuthe Siek
Assistant Examiner—Brandon Bowers
(74) Attorney, Agent, or Firm—Bever, Hoffman & Harms, LLP; Jeanette S. Harms

(57) ABSTRACT

A method and apparatus for determining equivalence between two integrated circuit device designs. Functional blocks and compare points within a first design are compared with functional blocks and compare points in a second design to determine compare points that are matched. The integrated circuit designs are traversed net-wise and cut points are inserted at compare points that are matched and that are not determined to be constant. As each design is traversed, the design is flattened such that flat copies of both integrated circuit designs are obtained (that include the inserted cut points). The flat copies of the integrated circuit designs are then compared to determine equivalence.

20 Claims, 5 Drawing Sheets

HIERARCHICAL VERIFICATION FOR EQUIVALENCE CHECKING OF DESIGNS

FIELD OF THE INVENTION

The present invention pertains to the field of semiconductor design verification. More specifically, an embodiment of the present invention relates to a method and apparatus for determining equivalence of integrated circuit device designs.

BACKGROUND ART

Advances in semiconductor technology have led to substantial increases in gate count for integrated circuit devices such as Application Specific Integrated Circuit (ASIC) devices. This has significantly increased the run time for semiconductor design verification processes and in particular, equivalency checking processes.

Equivalence checking during verification uses either flat processes or hierarchical processes. Flat verification processes consider the design as a whole and do not consider heirarchical boundaries at all. Flat verification processes have a relatively quick setup process. However, with large design sizes, memory capacities are strained, impacting whether the design completes verification. In addition, extracted logic cone sizes can become unyieldingly large, leading to longer run times and indeterminate or hard verifications. This consumes valuable hardware, software and human resources. Moreover, as devices continue to be more complex and as gate counts continue to increase the time demands of flat verification processes will continue to worsen.

Hierarchical verification processes partition a design hierarchically into functional blocks. A determination is then made as to whether the implementation design implements all of the functional blocks of the reference design. This simplifies verification by controlling cone size and complexity, resulting in substantial performance improvements over flat verification processes. In addition, hierarchical verification processes require less memory because they verify one functional block at a time.

However, traditional hierarchical verification may require complex setup information or simply fail to prove equivalence, producing a "false negative" result. This is due to changes that blocks undergo during the design process. For example, boundary optimization pushes logic into other levels of hierarchy, which causes verification failures unless the differences are accounted for. Block name changes throughout the design flow can adversely affect module name mapping. Clock tree insertion with clock lines that cross hierarchical boundaries cause unmatched clock pins, producing mapping problems.

When failures occur in traditional hierarchical verification, the failures must then be debugged to determine whether the designs are in fact equivalent if their complete context is considered. In some hierarchical processes, when failures occur, the results of the hierarchical verification processes are analyzed by flattening out the design where the failure is found. However this often does not provide sufficient information to determine equivalence. Moreover, in some cases, the design is flattened completely and verification must be run in flat mode, causing loss of the advantages of hierarchical verification.

What is needed is a method and apparatus that provides quick analysis and verification of a semiconductor design. In addition, a method and apparatus is needed for determining equivalence of integrated circuit designs that does not produce false negative results.

SUMMARY OF THE INVENTION

The present invention includes an equivalence checker that gives quick analysis and verification of a semiconductor design. In addition, the method and apparatus of the present invention allows for determining equivalence of integrated circuit device designs and does not produce false negative results.

A method for determining equivalence between two integrated circuit device designs is disclosed in which functional blocks within a first integrated circuit design (the reference design) are matched with functional blocks in a second integrated circuit design (the implementation design) to determine compare points that are matched. In one embodiment, only registers, top-level primary outputs and pins at hierarchical boundaries are compared and matched. However, alternatively, other points could be compared.

During verification, the entire designs are considered (not individual blocks) but cut points are inserted at hierarchical pins that are matched. In one embodiment, each integrated circuit design is divided into collections of logic cones.

As each design is traversed, the cones are flattened such that a flat copy of both the reference design and the implementation design are obtained (that include the inserted cut points). In the present embodiment, cut points are not inserted at compare points that are determined to be constant.

The flat copies of the reference design and the implementation design are then compared to determine equivalence. In the present embodiment, equivalence is determined by creating a miter and solving the miter to determine whether the reference design is equivalent to the implementation design. In the present embodiment, the equivalence checker evaluates whether the logic function at a given compare point in one design is equivalent to the matching compare point in the other design as indicated by the inserted cut points.

In one embodiment of the present invention, when the comparison determines that the reference design and the implementation design are not equivalent, some of the cut points are selectively removed and the two designs are again compared. This process is repeated, continuing to remove cut points and compare designs, until the comparison indicates that the two integrated circuit device designs are equivalent, or no cut points remain.

The method and apparatus of the present invention allows for comparisons of versions of the design, both register transfer level to gate level, and gate level to gate level. Verification can be performed throughout the design cycle to maintain complete functional equivalence during every stage of the process flow.

The method and apparatus of the present invention recognizes the complete function of compare points (registers and top-level primary outputs) as in traditional flat verification processes. This eliminates false-negative results without requiring the extensive setup of prior art hierarchical verification process. The method and apparatus of the present invention verifies every compare point considering its entire (flat) context; however, it also automatically limits the size and complexity of cones by selectively verifying matched hierarchical pin boundaries, when appropriate. The intelligent selection of hierarchical cut points results in performance levels similar to those of prior art hierarchical verification processes. However, the method and apparatus of the present invention gives accuracy and ease of setup of a traditional flat verification process.

Other features and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic information capable of being stored, transferred, combined, compared, and otherwise manipulated in a computer system. It has proven convenient at times, principally for reasons of common usage, to refer to these information as transactions, bits, values, elements, symbols, characters, fragments, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "analyzing," "flattening," "calculating," "comparing," "inserting" or the like, refer to actions and processes of a computer system or similar electronic computing device. The computer system or similar electronic computing device manipulates and transforms data represented as physical (electronic) quantities within the computer system memories, registers or other such information storage, transmission or display devices.

Exemplary Computer System

Figure 2:
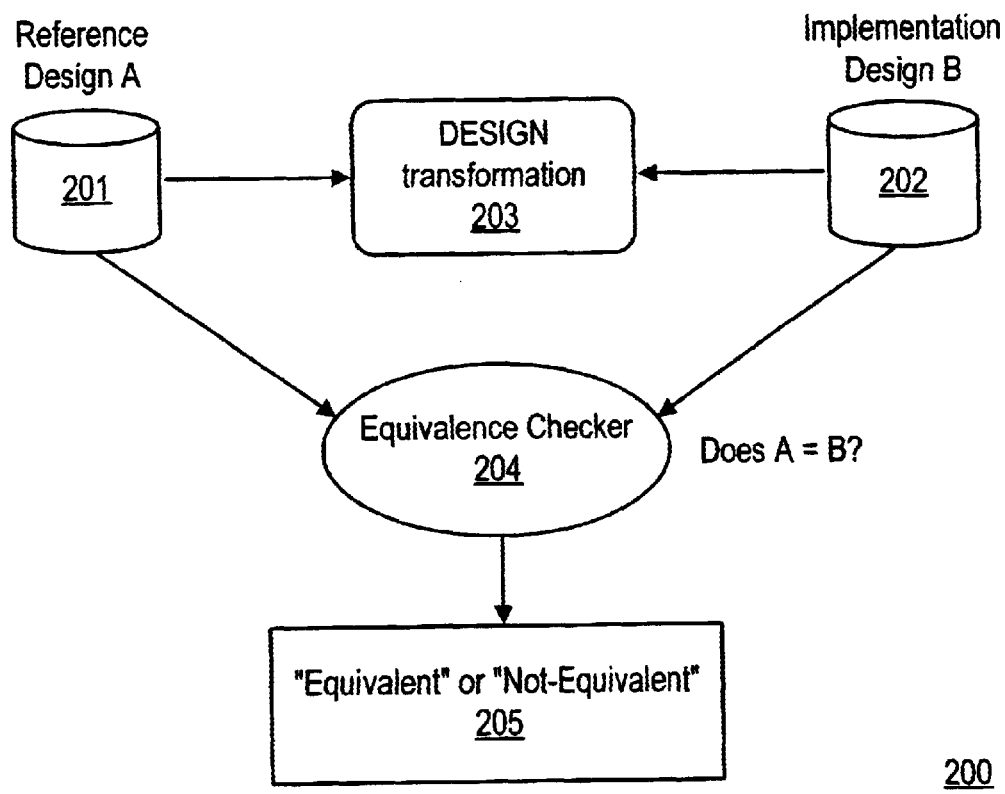
FIG. 2 shows an exemplary system for verification of a design in accordance with one embodiment of the present invention.

In general, computer system 10 of FIG. 2, used by an embodiment of the present invention, comprises an address/data bus 12 for communicating information and one or more central processor unit 14 coupled with bus 12 for processing information and instructions. Central processor unit 14 may be a microprocessor or any other type of processor. Computer system 10 also includes data storage features such as a computer usable volatile memory unit 16 (e.g., random access memory, static RAM, dynamic RAM, etc.) and non-volatile memory unit 18 that are coupled with bus 12 for storing information and instructions for processor(s) 14. System 10 also includes optional signal input and output communication device 28 coupled with bus 12 for enabling computer system 10 to interface with other electronic devices. In one embodiment of the present invention, input and output communication device 28 is a serial communication port, but could also use any number of well known communication standards and protocols, e.g., Universal Serial Bus (USB), Ethernet, FireWire (IEEE 1394), parallel, small computer system interface (SCSI), infrared (IR) communication, Bluetooth wireless communication, etc.

Computer system 10 also includes a data storage device 20 ("disk subsystem") such as a magnetic or optical disk and disk drive coupled with the bus 12 for storing information and instructions. Data storage device 20 can include one or more removable magnetic or optical storage media such as disk drives, magnetic tape, Computer Disks (CD's), Digital Video Disks (DVD's), etc.

Optionally, computer system 10 can include a display device 22 that is coupled to bus 12 for displaying graphics and/or video. It should be appreciated that optional display device 22 may be a cathode ray tube (CRT), flat panel liquid crystal display (LCD), field emission display (FED), or any other display device suitable for displaying video and/or graphic images and alphanumeric characters recognizable to a user. Furthermore, system 10 can include an optional alphanumeric input device 24 including alphanumeric and function keys coupled to the bus 12 for communicating information: and command selections to the central processor(s) 14. Additionally, the computing device 10 of FIG. 2 can include an optional cursor control device 26 coupled to the bus 12 for communicating user information and command selections to the central processor(s) 14.

Exemplary Verification

Referring now to FIG. 2, an exemplary system 200 is shown that includes equivalence checker 204 for static verification of a design by performing an equivalence check. An original design commonly referred to as a "reference design" is stored in database A. The original design can be a system on a chip design such as, for example, an Application Specific Integrated Circuit (ASIC) device design. Design transformation processes are performed on the reference design to obtain an implementation design that is stored in database B.

Continuing with FIG. 2, equivalency checker 204 finds implementation errors by determining whether reference design that is stored in database A is equivalent to the implementation design that is stored in database B. The output, shown by block 205 indicates that the designs are equivalent or that the designs are not equivalent.

In the present embodiment, equivalency checker 204 can check VHDL, Verilog, mixed VHDL and Verilog files, EDIF files and Synopsys Data Base (DB) files, etc. However, alternatively, other file formats could also be checked.

Figure 3:
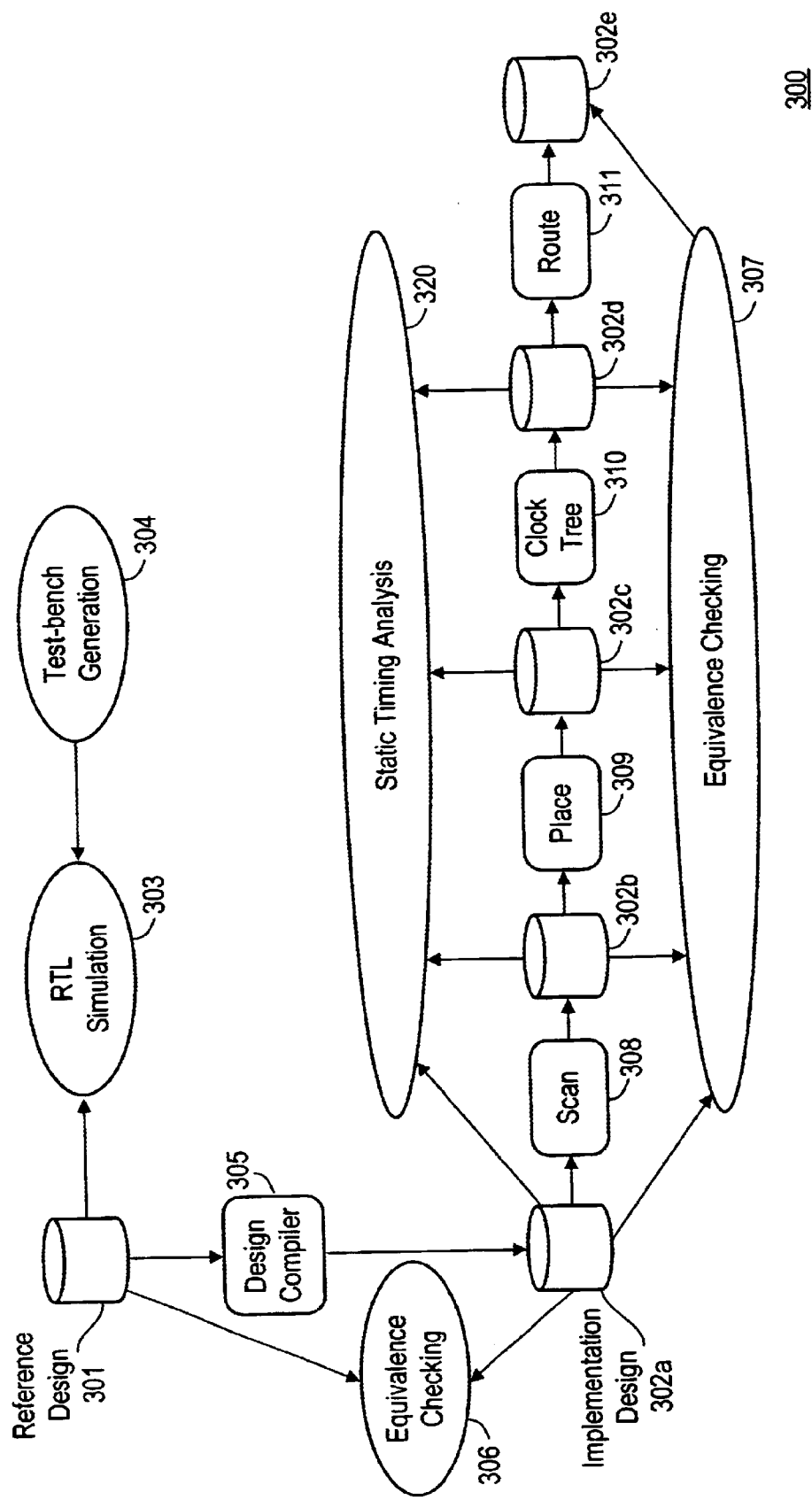
FIG. 3 shows an exemplary system for verification of a design and illustrates static verification at both the register transfer level and the gate level domain in accordance with one embodiment of the present invention.

Referring now to FIG. 3, an exemplary system 300 is shown for performing static verification of implementation design 302a–e in accordance with one embodiment of the present invention. Conventional functional verification is then performed at the register transfer level as shown by blocks 303–304. More particularly, register transfer level simulation 303 and test-bench generation 304 are performed on reference design 301. Also, static timing analysis is performed as shown by block 320.

In the present embodiment, design compiler 305 generates implementation design 302a that is stored in a database. Equivalence checking is performed as shown by blocks 306–307. Also, static timing analysis can be performed as shown by block 320.

Continuing with FIG. 3, equivalence checking can be performed on the initial implementation design 302a and can be performed on subsequent versions of the implementation design, shown as implementation design versions 302b14 302e. For example, equivalence checking can be performed on implementation design 302b formed by performing scan process 308 produces implementation design 302b. Equivalence checking can also be performed on implementation design 302c formed by performing place process 309 on implementation design 302b. Equivalence checking can also be performed on implementation design 302d formed by performing clock tree process 310 on implementation design 302c. Final sign-off is then achieved by performing equivalence checking on implementation design 302e formed by performing a routing process 310 on implementation design 302d.

Method for Determining Equivalence

Figure 1:
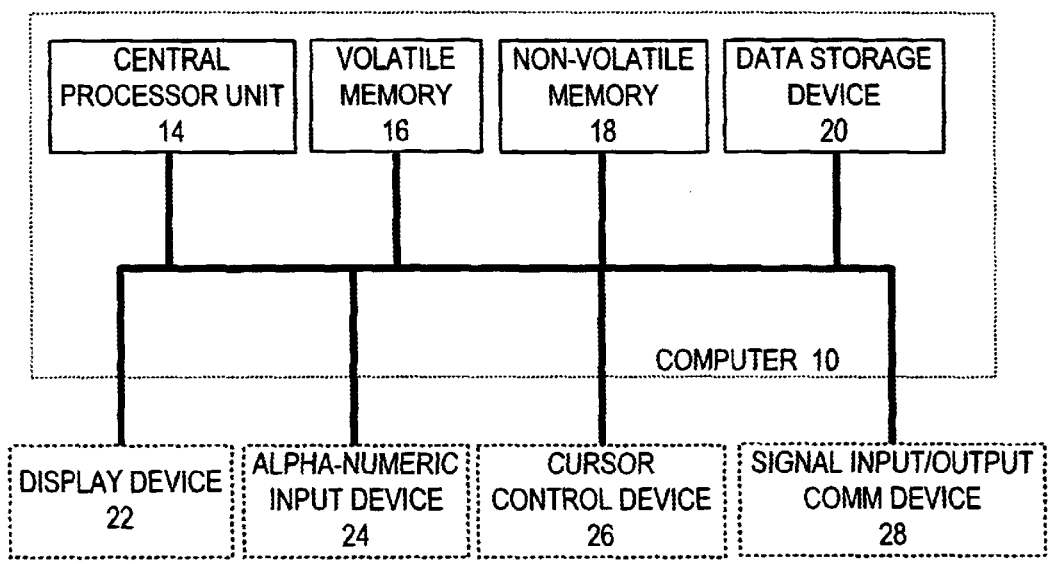
FIG. 1 is a block diagram illustrating an exemplary computer system in accordance with one embodiment of the present invention.
Figure 4:
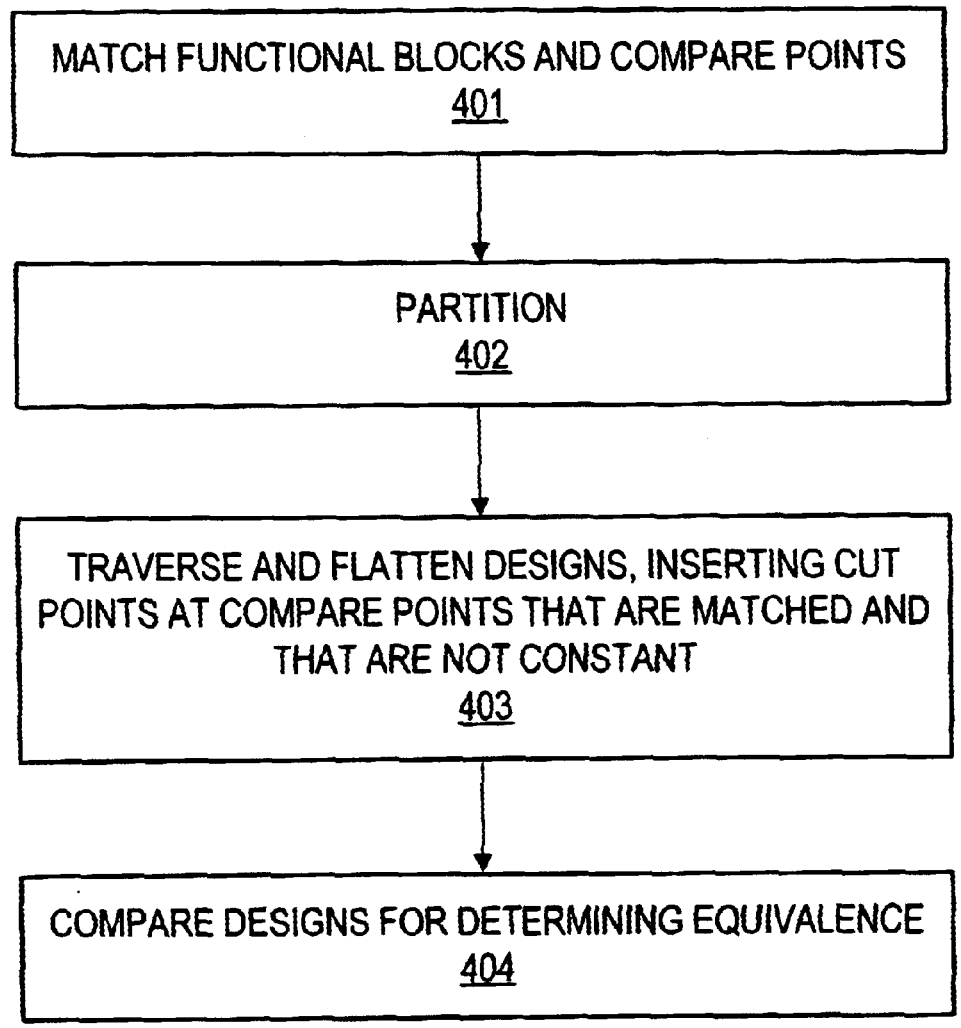
FIG. 4 is a block diagram that illustrates a method for determining equivalence of designs in accordance with one embodiment of the present invention.

Referring now to FIG. 4, a method 400 for determining equivalence is shown. In one embodiment, method 400 is performed using software implemented in a computer system such as computer system 10 illustrated in FIG. 1. Alternatively, hardware or firmware can be used to perform method 400.

The designs are segmented at hierarchical boundaries into functional blocks. As shown by step 401, functional blocks and compare points (pins, ports and registers) within the reference design are then compared to functional blocks and compare points in the implementation design to identify functional blocks and compare points that match. In the present embodiment, only registers, top-level primary inputs, top-level primary outputs, and hierarchical boundaries are matched. In the present embodiment, matching is performed using the object names to determine functional blocks and compare points that are matched. However, other methods can also be used to match some or all compare points. Thus, for example, when both the reference design and the implementation design include a functional block named ALU that includes a pin called $bus_{13}$ 1, the two pins are matched.

As shown by step 402, the design is partitioned into top-level partitions. Any of a number of known partitioning methods can be used. By partitioning the design, individual partitions can be processed separately, reducing memory requirements and processor load. However, it is appreciated that partitioning may not be required when the designs being tested for equivalence are not large.

For each top-level partition, the design is traversed netwise as shown by step 403 and is flattened to create a flat design copy that includes cut points. The cut points are inserted at compare points that were matched in step 402, that are not constant, and that have not already failed verification in a previous partition. In addition, in the present embodiment, multiply-driven nets are resolved, registers are normalized and combinational logic cycles are eliminated as needed to perform verification.

As shown by step 404, the flat reference design is then compared to the flat implementation design in order to determine equivalence. In the present embodiment, a verification engine is used to determine equivalence. The verification engine can be implemented in either hardware or in software. The verification engine processes miter logic that is created within the flat design for determining whether the implementation design is equivalent. If the implementation design is determined to be equivalent, the design is deemed to be "verified." If the implementation design is not determined to be equivalent, the design is deemed to be "not verified."

In comparison step 404 the insertion of cut points at matched, non-constant compare points provides for comparison using a hybrid approach that includes both hierarchical and flat characteristics. More particularly, the method and apparatus of the present invention, when looking at a cone of logic between two registers or between registers and primary inputs at the top level of the design does not consider the design either exclusively hierarchically or flat. Rather, the entire flat cone is used for verification, with the cone cut using cut points where the hierarchical boundaries are matched (for compare points that are not constant). At functional boundaries where compare points are not matched, no cut points are created such that the cone of logic is completed all the way out to include the flat design up to the next matched hierarchical boundaries or the entire flat design. Thus, the designs are compared for matching functionality using the inserted cut points and the remainder of the designs are compared using flat processes (taking full functionality into account). This avoids the false negative problem that arises from viewing the design completely hierarchically and avoids the performance requirements of viewing the design entirely flat.

FIG. 500 shows a more detailed method for determining equivalence in accordance with one embodiment of the present invention. First, as shown by step 501 the circuit is segmented into logic cones with boundaries represented by source points and end points. In the embodiment shown in FIGS. 2–3, both the circuits of reference design 301 and the circuits of implementation design 302 are segmented into logic cones. The term "logic cone" as the term is used in the present application includes the combinational (non-stateholding) logic between registers and primary inputs and outputs.

As shown by step 502 constant compare points are identified. More particularly, compare points (registers or input/output pins) within each logic cone that maintain a constant zero or a constant one are identified. In the embodiment shown in FIGS. 2–3, both the circuits of reference design 301 and the circuits of implementation design 302 are searched to identify compare points that maintain a logical zero or a logical one.

As shown by step 503, functional blocks and compare points are matched. More particularly, functional blocks and compare points (pins, ports and registers) within the reference design are compared to functional blocks and compare points in the implementation design to identify functional blocks and compare points that match. In the embodiment shown in FIG. 2, the circuits of reference design 201 are compared to the circuits of implementation design 202 to find matching functional blocks and compare points.

For each logic cone, the design is traversed net-wise as shown by step 504 and is flattened to create a flat design copy that includes cut points. The cut points are inserted at compare points that were matched in step 503 and that were not determined to be constant in step 502. For example, extra clock lines in an implementation design that do not have a match in the reference design are not matched, therefore no cut points will be created for these extra clock lines. Also, no cut points will be created for compare points that have constant value.

A miter is created as shown by step 505. In the embodiment shown in FIG. 2, the circuits of reference design 201 and the circuits of implementation design 202 are flattened (step 504) to create flat design copies. These flat design copies are then used to create the miter (step 505).

The miter is then solved as shown by step 506. In the present embodiment a verification engine is used to solve the miter. The verification engine can be implemented in software or hardware of a computing device (e.g., computer 10 of FIG. 1). In the embodiment shown in FIG. 3, the miter performs a formal verification that compares the functional equivalency of the register transfer level source (reference design 301) to the post-synthesis gate-level netlist of implementation designs 302a–302e. The output from step 506 indicates whether the verification was successful as shown by block 507.

When a successful verification results, the process ends as shown by step 511 with a message that indicates that verification was successful.

However, when the verification is not successful, as shown by steps 507–508, cut points are selectively removed and a new miter is created and run that does not include the cut points removed in step 508. Steps 506–508 are repeated until a successful verification results or until no cut points remain as shown by steps 509–510. When all cut points have been removed such that no cut points remain, as shown by block 510, the process ends and a message is generated that indicates that verification failed.

Because matching step 503 includes matching of compare points at functional boundaries, and because only some compare points will match, only some functional elements will be represented hierarchically. The remainder of the design will be represented flat. Accordingly the method and apparatus of the present invention, when looking at a cone of logic between two registers or between registers and primary inputs at the top level of the design the design is not looked at either exclusively hierarchically or flat. This avoids the false negative problem that arises from viewing the design completely hierarchically and avoids the performance requirements of viewing the design entirely flat.

Figure 5:
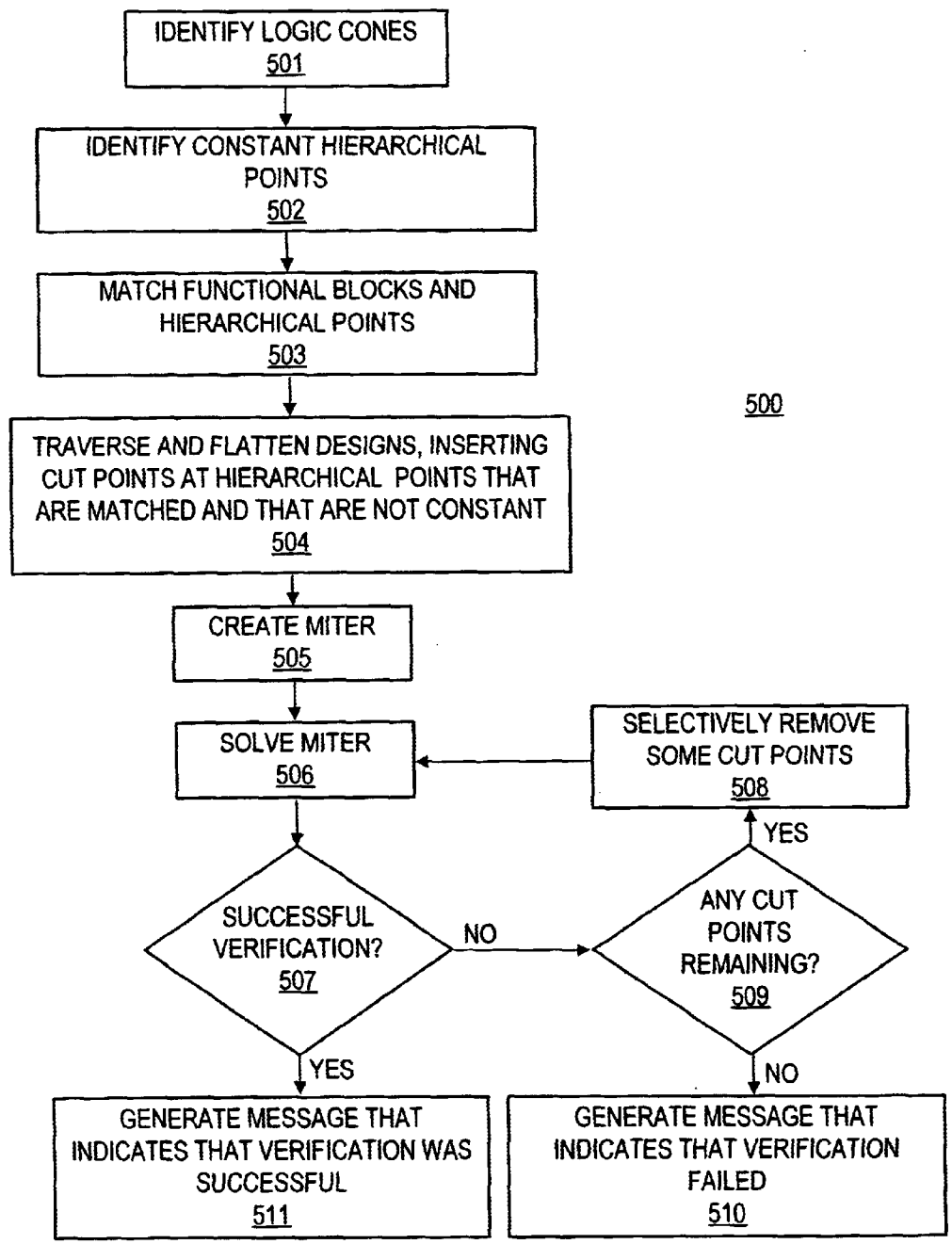
FIG. 5 is a block diagram that illustrates a more detailed method for determining equivalence of designs in accordance with one embodiment of the present invention.

In one embodiment, method 500 of FIG. 5 is performed on partitioned data. That is, the data is partitioned prior to performing step 501 and steps 501–508 are performed on each set of partitioned data with individual partitions processed sequentially. However, partitions could also be processed in parallel.

The method and apparatus of the present invention allows for comparisons of versions of the design, both register transfer level to gate level, and gate level to gate level. This verification is used throughout the design cycle to maintain complete functional equivalence at the gate level during every stage of the flow. Thus, for example, in the embodiment shown in FIG. 3, verification is used after scan chain insertion 308, after in-place optimization 309, after clock-tree synthesis 310, after routing 311, after manual netlist edits, etc. This eliminates the need to perform time consuming gate-level simulations throughout the design cycle. Accordingly the method and apparatus of the present invention allows an engineer to run multiple verifications in a single day, as opposed to completing one turn a day (or one turn every two to three weeks for larger designs).

Instead of verifying blocks "upwards" as occurs in prior art processes, the method and apparatus of the present invention recognizes the top-cells as in traditional flat verification processes. This eliminates false-negative results without requiring the setup of hierarchical verification. The method and apparatus of the present invention verifies every compare point considering its entire (flat) context; however, it also automatically limits the size and complexity of cones by selectively verifying matched hierarchical boundaries, when appropriate. The intelligent selection of hierarchical boundaries results in performance levels similar to or better than those of prior art hierarchical verification processes. However, the method and apparatus of the present invention gives accuracy and ease of setup of a traditional flat verification process. In addition, the method and apparatus of the present invention has memory consumption levels similar to those of hierarchical verification methods.

The preferred embodiment of the present invention, a method and apparatus for determining equivalence is thus described. While the present invention has been described in particular embodiments, it should be appreciated that the present invention should not be construed as limited by such embodiments, but rather construed according to the below claims.

What is claimed is:

1. A method for determining equivalence between a first integrated circuit device design and a second integrated circuit device design comprising:

comparing functional blocks and compare points within said first integrated circuit device design with functional blocks and compare points in said second integrated circuit device design to determine compare points that are matched;

inserting cut points at compare points within said first integrated circuit design and within said second integrated circuit design that are matched;

flattening said first integrated circuit device design and said second integrated circuit device design such that a flat copy of said first integrated circuit device design and a flat copy of said second integrated circuit device design are obtained that include said cut points; and comparing said flat copy of said second integrated circuit device design to said flat copy of said first integrated circuit device design to determine equivalence.

2. The method of claim 1 wherein said first integrated circuit device design and said second integrated circuit device design are partitioned into a plurality of partitions and wherein said partitions are separated into logic cones.

3. The method of claim 2 wherein said partitions are separated into logic cones.

4. The method of claim 1 wherein inserting cut points at compare points that are matched further comprising not inserting cut points at compare points that are determined to be constant.

5. The method of claim 4 wherein said step of comparing functional blocks and compare points within said first integrated circuit design with functional blocks and compare points in said second integrated circuit device design to determine compare points that are matched further comprises matching only registers, top-level primary outputs, and pins at hierarchical boundaries.

6. The method of claim 4 wherein comparing said flat copy of said second integrated circuit device design to said flat copy of said first integrated circuit device design further comprises:

creating a miter; and running said miter to determine whether said first integrated circuit device design is equivalent to said second integrated circuit design.

7. The method of claim 5 wherein, when said comparison determines that said first integrated circuit device design is not equivalent to said second integrated circuit design, ones of said cut points are selectively removed and said flat copy of said first integrated circuit device design is again compared to said flat copy of said second integrated circuit device design to determine whether said first integrated circuit device design is equivalent to said second integrated circuit design.

8. In a computer system including a processor coupled to a bus, and a memory unit coupled to the bus for storing information, a computer-implemented method for determining equivalence between a first integrated circuit device design and a second integrated circuit device design comprising:

comparing functional blocks and compare points within said first integrated circuit device design with functional blocks and compare points in said second integrated circuit device design to determine compare points that are matched;

inserting cut points at compare points within said first integrated circuit design and within said second integrated circuit design that are matched;

flattening said first integrated circuit device design and said second integrated circuit device design such that a flat copy of said first integrated circuit device design and a flat copy of said second integrated circuit device design are obtained that include said cut points; and comparing said flat copy of said second integrated circuit device design to said flat copy of said first integrated circuit device design to determine equivalence.

9. The computer-implemented method of claim 8 wherein said first integrated circuit device design and said second integrated circuit device design are partitioned into a plurality of partitions.

10. The computer-implemented method of claim 8 said partitions are separated into logic cones.

11. The computer-implemented method of claim 8 wherein inserting cut points at compare points that are matched further comprises hot inserting cut points at compare points that are determined to be constant.

12. The computer-implemented method of claim 11 wherein comparing functional blocks and compare points within said first integrated circuit device design with functional blocks and compare points in said second integrated circuit device design to determine compare points that are matched further comprises comparing only registers, top-level primary outputs, and pins at hierarchical boundaries.

13. The computer-implemented method of claim 12 wherein said step of comparing said flat copy of said second integrated circuit device design to said flat copy of said first integrated circuit device design further comprises:

creating a miter; and solving said miter to determine whether said first integrated circuit device design is equivalent to said second integrated circuit device design.

14. The computer-implemented method of claim 12 wherein, when said comparison determines that said first integrated circuit device design is not equivalent to said second integrated circuit device design, ones of said cut points are selectively removed and said flat copy of said first integrated circuit device design is again compared to said flat copy of said second integrated circuit device design to determine whether said first integrated circuit device design is equivalent to said second integrated circuit device design.

15. A computer-readable storage medium storing instructions that, when executed by a computer, cause the computer to perform a method for determining equivalence between a first integrated circuit device design and a second integrated circuit device design comprising:

comparing functional blocks and compare points within said first integrated circuit device design with functional blocks and compare points in said second integrated circuit device design to determine compare points that are matched;

traversing said first integrated circuit device design and said second integrated circuit device design net-wise;

inserting cut points at compare points that are matched as said first integrated circuit device design and said second integrated circuit device design are traversed;

flattening said first integrated circuit device design and said second integrated circuit device design as said first integrated circuit device design and said second integrated circuit device design are traversed such that a flat copy of said first integrated circuit device design and a flat copy of said second integrated circuit device design are obtained that include said cut points; and comparing said flat copy of said second integrated circuit device design to said flat copy of said first integrated circuit device design to determine equivalence.

16. The computer-readable storage medium of claim 15 wherein said first integrated circuit device design and said second integrated circuit device design are partitioned into a plurality of partitions and wherein said partitions are separated into logic cones.

17. The computer-readable storage medium of claim 15 wherein inserting cut points at compare points that are matched further comprising not inserting cut points at compare points that are determined to be constant.

18. The computer-readable storage medium of claim 17 wherein comparing functional blocks and compare points within said first integrated circuit device design with functional blocks and compare points in said second integrated circuit device design to determine compare points that are matched further comprises comparing registers, top-level primary outputs, and pins at hierarchical boundaries.

19. The computer-readable storage medium of claim 18 wherein said step of comparing said flat copy of said second integrated circuit device design to said flat copy of said first integrated circuit device design further comprises:

creating a miter; and solving said miter to determine whether said first integrated circuit device design is equivalent to said second integrated circuit device design.

20. The computer-readable storage medium of claim 19 wherein, when said comparison determines that said first integrated circuit device design is not equivalent to said second integrated circuit device design, ones of said cut points are selectively removed and said flat copy of said first integrated circuit device design is again compared to said flat copy of said second integrated circuit device design to determine whether said first integrated circuit device design is equivalent to said second integrated circuit device design.

* * * * *

UNITED STATES PATENT AND TRADEMARK OFFICE
CERTIFICATE OF CORRECTION

PATENT NO. : 6,668,362 B1
DATED : December 23, 2003
INVENTOR(S) : McIlwain et al.

It is certified that error appears in the above-identified patent and that said Letters Patent is hereby corrected as shown below:

Column 9,
Line 48, "comprises hot inserting" is replaced with -- comprises not inserting --

Signed and Sealed this

Twenty-ninth Day of June, 2004

JON W. DUDAS
*Acting Director of the United States Patent and Trademark Office*